United States Patent
Suzuki et al.

(10) Patent No.: US 6,774,316 B1
(45) Date of Patent: Aug. 10, 2004

(54) WIRING BOARD AND PRODUCTION METHOD THEREOF

(75) Inventors: Takeshi Suzuki, Osaka (JP); Tatsuo Ogawa, Atlanta, GA (US); Satoru Tomekawa, Osaka (JP); Yoshihiro Bessho, Osaka (JP); Tousaku Nishiyama, Nara (JP); Tetsuyoshi Ogura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 177 days.

(21) Appl. No.: 09/890,145

(22) PCT Filed: Nov. 24, 2000

(86) PCT No.: PCT/JP00/08274

§ 371 (c)(1),
(2), (4) Date: Jul. 26, 2001

(87) PCT Pub. No.: WO01/39561

PCT Pub. Date: May 31, 2001

(30) Foreign Application Priority Data

Nov. 26, 1999 (JP) ............................................ 11-335758

(51) Int. Cl.⁷ ............................ H01R 12/04; H05K 1/11
(52) U.S. Cl. .......................................... 174/262; 29/852
(58) Field of Search ................................. 174/262–266; 439/65, 76.1, 77, 78, 85, 67–73; 29/847, 852, 853, 846

(56) References Cited

U.S. PATENT DOCUMENTS

| 5,435,480 | A | * | 7/1995 | Hart et al. | .................. 174/264 |
| 5,624,741 | A | * | 4/1997 | Scott | .......................... 174/262 |
| 6,103,359 | A | * | 8/2000 | Doi | ............................ 174/262 |
| 6,109,507 | A | * | 8/2000 | Yagi et al. | ............... 228/248.1 |
| 6,143,116 | A | * | 11/2000 | Hayashi et al. | ............. 156/233 |
| 6,346,317 | B1 | * | 2/2002 | Ritland et al. | .............. 174/250 |

FOREIGN PATENT DOCUMENTS

| JP | 09-116273 | 5/1997 |
| JP | 10-335526 | 12/1998 |

* cited by examiner

Primary Examiner—David E. Graybill
Assistant Examiner—Jeremy Norris
(74) Attorney, Agent, or Firm—McDermott, Will & Emery

(57) ABSTRACT

The present invention aims to provide a wiring substrate highly reliable in insulation and connection and a method for manufacturing the wiring substrate. A wiring substrate having two or more wiring layers, insulation layers interposed between the neighboring wiring layers and containing an organic resin, and a via formed in the insulation layers and extended between neighboring wiring layers. The via including functional substances, as well as some of the voids (first voids) where at least the organic resins from the insulation layers exist and the remaining voids (second voids) where a gas exists.

27 Claims, 12 Drawing Sheets

F I G. 2
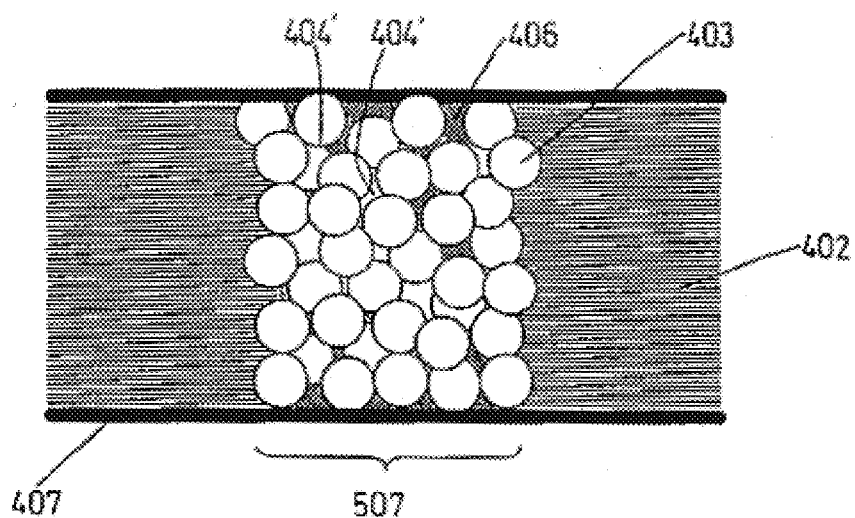
F I G. 3
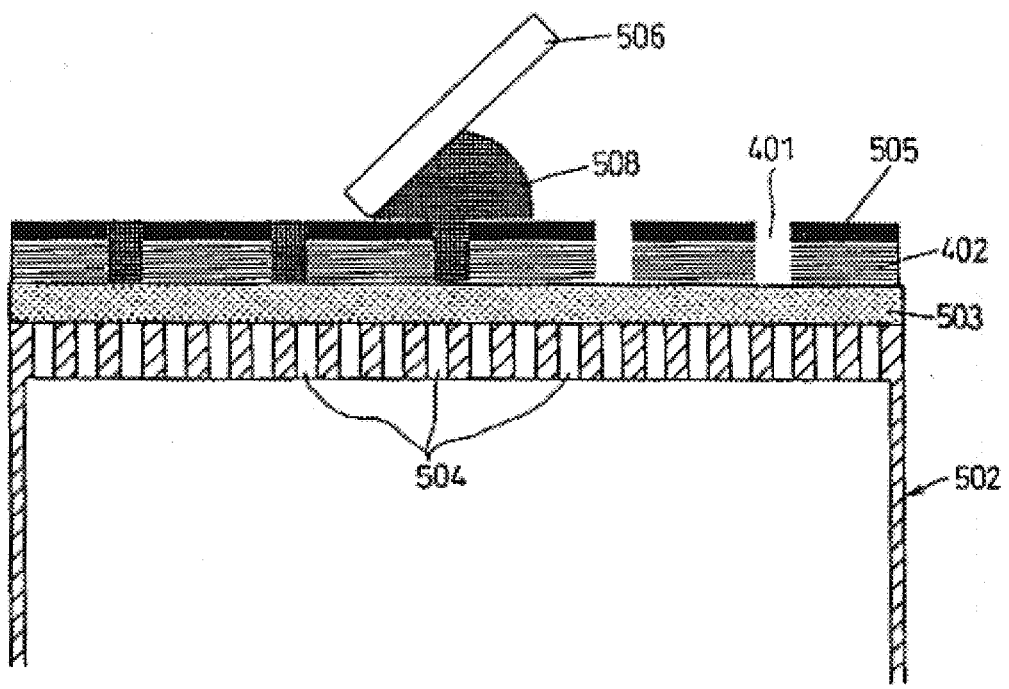

F I G. 10 A
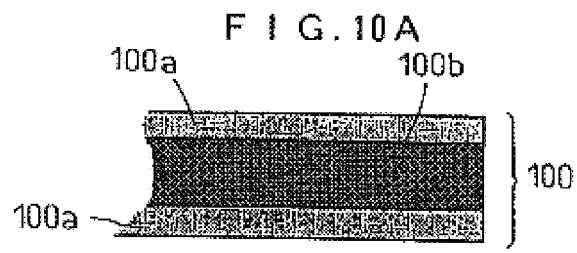
F I G. 10 B
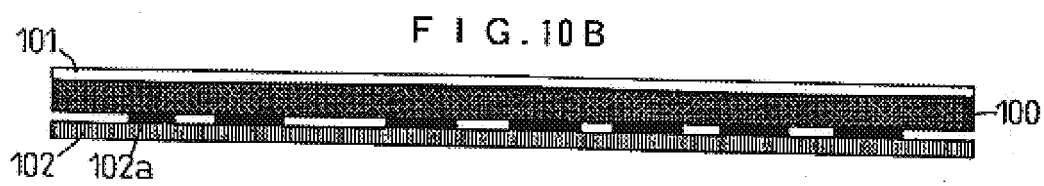
F I G. 10 C
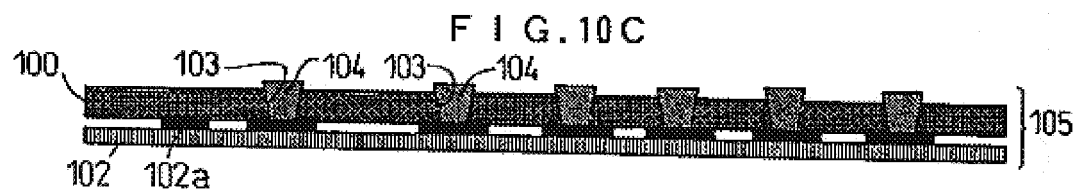
F I G. 10 D
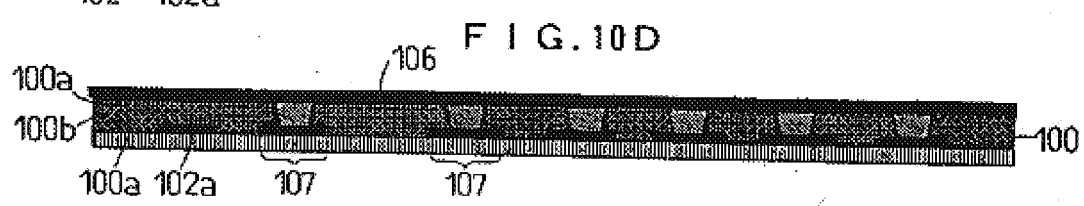
F I G. 10 E
F I G. 10 F
F I G. 10 G

F I G. 10H
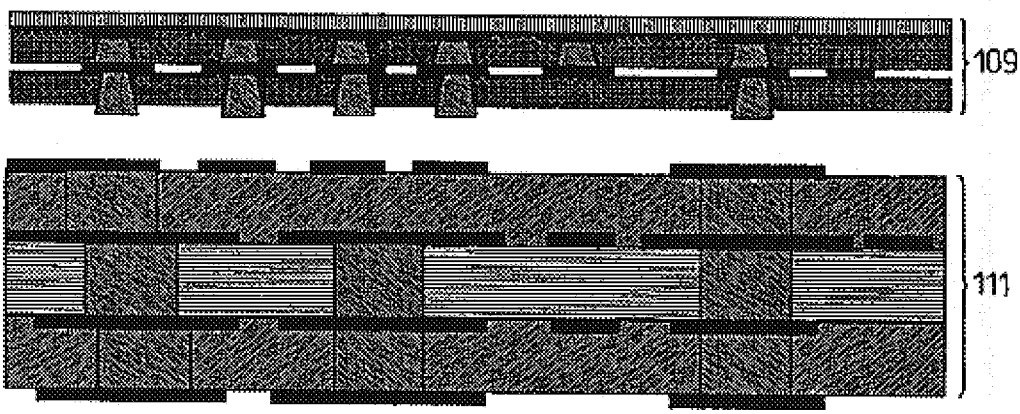
F I G. 10 I
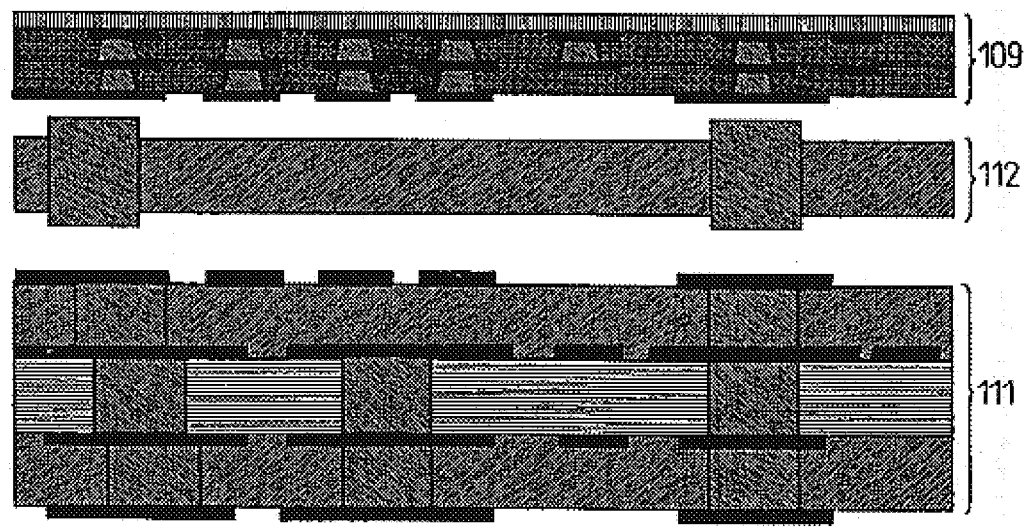
F I G. 10 J
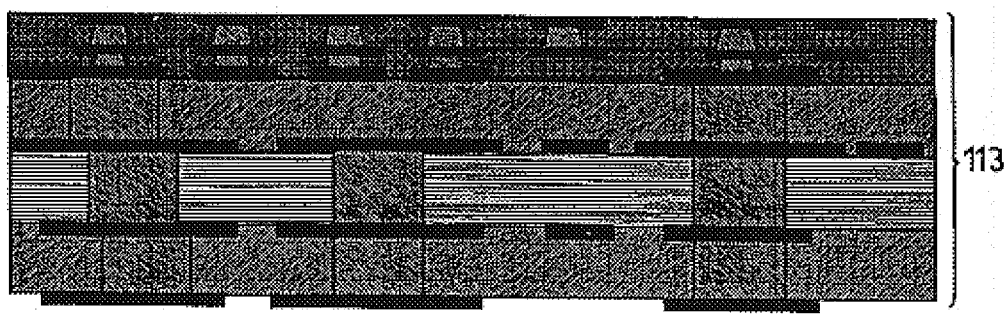

F I G. 12A
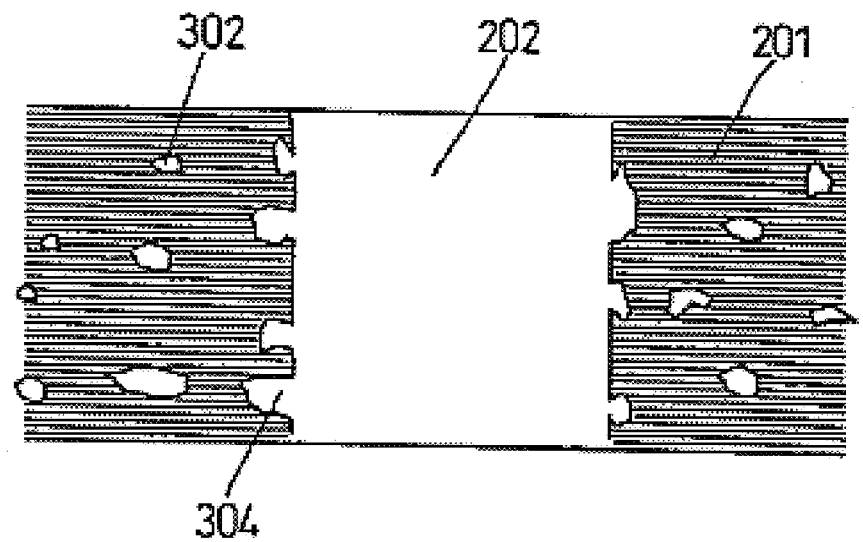
F I G. 12B
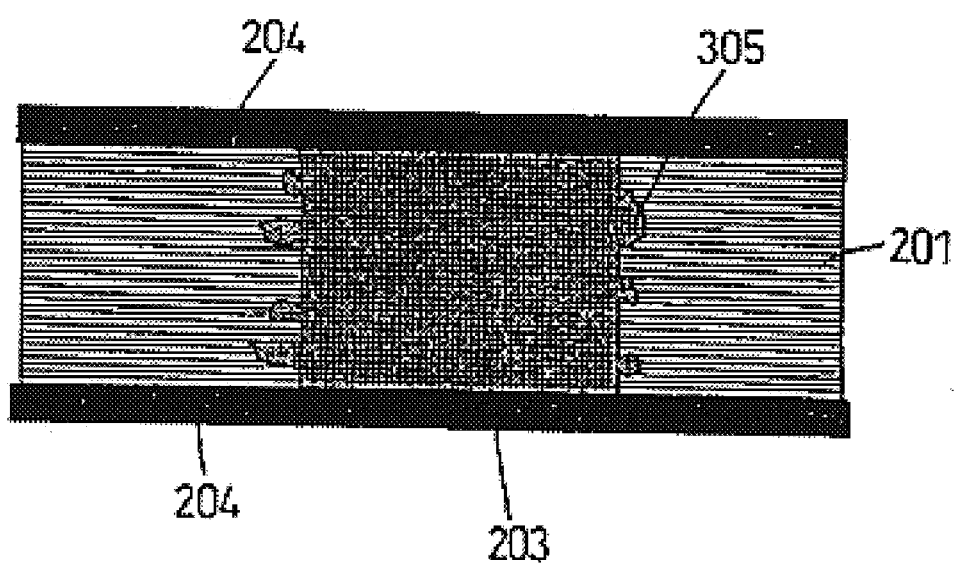

WIRING BOARD AND PRODUCTION METHOD THEREOF

FIELD OF INVENTION

The present invention relates to a wiring substrate and a manufacturing method thereof, and more particularly, to a wiring substrate having a low inter-layer connection resistance, provided with reliability in terms of electric insulation and reliability in terms of electric and mechanical connection, and suitable for a multi layer structure and a method for manufacturing such a wiring substrate.

PRIOR ART

It is important for a wiring substrate which is so formed in a multi layer structure as to highly densely mount semiconductor chips of LSI and the like that a plurality of wiring layers formed at fine wiring pitches can electrically be connected to one another at low connection resistance.

For that, in place of a conventional multi layer wiring substrate employing an inter-layer connection manner by through holes, a first technique and a second technique for enabling any electrode of a multi layer wiring substrate to be inter-layer-connected at any wiring layer position have already been disclosed in Japanese Unexamined Patent Publication No. Hei 6-268345 and Japanese Unexamined Patent Publication No. Hei 10-335526, respectively.

Hereinafter, the summary of both techniques will be described.

The First Technique

As it will be described with reference to FIG. 11, the first technique is to connect only necessary inter-layers by filling a conductive paste in inner via holes of a multi layer wiring substrate.

The outline of the connection process will be described with reference to FIG. 11(a) to FIG. 11(d).

As illustrated in FIG. 11(a), a through hole 202 is formed in a porous substrate 201 having void 302 and then as illustrated in FIG. 11(b), the through hole 202 is filled with a conductive paste 203 containing a conductive filler and a thermoplastic resin.

As illustrated in FIG. 11(c), copper foils 204 are overlaid on both side of the porous insulation substrate 201 and the insulation substrate 201 and the copper foils 204 are thermally press-bonded to cure the conductive paste 203 and both copper foils 204 are electrically connected through the conductive paste 203 and as illustrated in FIG. 11(d), the copper foil 204 are patterned in desired patterns to form wiring layers 205.

In the thermal press-bonding process in FIG. 11(c), the conductive paste 203 is pressurized in the thickness direction and the resin of the conductive paste 203 penetrates the voids 302 of the porous substrate 201. Consequently, the packed density of the conductive particles is increased and the conductive particles are brought into contact with one another to actualize the conductivity and connect wiring layers.

However, in case of the first technique, since the insulation substrate 201 is porous, as illustrated in FIG. 12(a), voids 302 exist in the peripheral parts of the position where the through hole 202 is formed. Attributed to the voids 302, recesses 304 recessed outward in the inner walls of the through hole 202 are formed.

When the through hole 202 having such recesses 304 is filled with the conductive paste 203 and the copper foils 204 are overlaid and thermally press-bonded, as illustrated in FIG. 12(b), the conductive paste 203 flows in the recesses 304 and causes so-called paste bleed 305, which is penetration of the insulation substrate layer 201 with the conductive paste.

In case of the first technique, since an electric field tends to be converged upon the paste bleed 305 and electric short circuiting to a wiring layer beside is easily caused attributed to the outward projected shape of the past bleed, the first technique leaves room for improvement in terms of insulation reliability.

The Second Technique

In case of the second technique, a thermosetting resin-containing insulation layer is disposed between an upper and a lower wiring patterns. The insulation substrate has a via containing a conductive paste (containing a metal powder, a binder, a solvent and the like). The binder and the solvent are removed by heating the insulation substrate. Consequently, gaps are formed among metal powder particles in the via. High pressure is applied to the thermosetting resin before complete curing to penetrate the via with the organic resin of the insulation substrate and to fill the gaps among the metal powder particles with the organic resin.

However, in case of the second technique, although there occurs no so-called paste bleed in which the conductive paste penetrates the insulation substrate, the loading ratio of the metal powder in the voids in the via is about 65% or higher and the voids are about 35% or lower. The voids are entirely filled with the organic resin and the resin is cured.

For that, no void is left in the entire via and the elasticity modulus as a whole is increased and the hardness is high. Therefore, even if mechanical stress is applied to the wiring substrate by heat in the thickness, direction, the entire body of the wiring substrate is hardly expanded or contracted responding to the stress and the wiring layers tend to be easily disconnected with the metal powder in the via. As a result, there is left room for improvement in terms of the reliability of electric and mechanical connection between wiring layers.

Consequently, the present invention mainly object to provide a wiring substrate with improved reliability of wiring layers in terms of insulation and connection and to provide a method for manufacturing such a wiring substrate.

DISCLOSURE OF THE INVENTION (1) A first wiring substrate of the present invention comprises two or more wiring layers, insulation layers disposed between the foregoing neighboring wiring layers and containing an organic resin, and vias formed in the insulation layers for connecting the wiring layers, wherein the vias contain a plurality of functional substances and surrounded with voids each of which comprises first voids containing the organic resin from the insulation layers and second voids containing a gas.

For that, in the first case of the present invention, so-called paste bleed, which is penetration of an insulation layer with a conductive paste, does not occur and further, the elasticity modulus is low and the wiring substrate is made soft since the voids in a through holes are not all filled with an organic resin and some voids containing a gas such as air but not being filled with the organic resin exist, the elasticity modulus is low and the flexibility is improved in the entire via. Therefore, even if mechanical stress is applied to the wiring substrate by heat in the thickness direction, the via easily follow expansion and the contraction of the entire body of the wiring substrate responding to the stress and the upper and the lower wiring layers tend to be hardly disconnected with the functional substances such as a metal powder in the via and as a result, the reliability of electric and mechanical connection between the upper and lower wiring layers is heightened.

(2) A second wiring substrate of the present invention comprises two or more wiring layers, insulation layers disposed between the foregoing neighboring wiring layers, and vias formed in the insulation layers for connecting the wiring layers, wherein each of the insulation layers is a film bearing an adhesive layer containing an adhesive in at least one face and the vias contain a functional substance and the adhesive same as that in the adhesive layer and penetrating the voids surrounded the functional substance and existing in the voids.

In the second case of the present invention, paste bleed does not at all takes place and since the voids are formed in the surrounding of the functional substance contained in the vias and the adhesive of the adhesive layers penetrates the voids, no clear interface exists between the vias and the adhesive layers. Therefore, separation in an interface of a via and an adhesive layer hardly occurs and the reliability in terms of connection is heightened. A wiring substrate consequently provided has high reliability in insulation between neighboring wiring layers and high reliability in electric and mechanical connection between both upper and lower wiring layers.

(3) In the respectively improved wiring substrates of the first and the second of the present invention, the second voids are preferably formed selectively in agglomeration parts in the functional substance.

Owing to that, the second voids surrounded with the agglomeration parts of the functional substance are hardly degassed and the organic resin or the adhesive are made difficult to penetrates the voids, the low elasticity modulus is stably kept for a long duration and thus the reliability in the electric and mechanical connection of the upper and the lower wiring layers is heightened.

(4) In the respectively improved wiring substrates of the first and the second of the present invention, the second voids are preferably formed as to have the average volume smaller than the average volume of a plurality of respective functional substances forming at least the agglomeration parts.

Owing to that, even is a high mechanical stress is applied to the vias by expansion or contraction of the wiring substrates, the agglomeration state of the functional substances is kept well and thus the retain-ability of the second voids by the functional substances is heightened to make the second voids hardly crushed and to keep the low elasticity modulus for a long duration by the second void. In other words, the wiring substrates provided have the reliability in the electric and mechanical connection of the upper and the lower wiring layers kept stably for a long duration and for that, to keep the average volume in such a manner is preferable.

Incidentally, the foregoing wiring layers include un-patterned wiring layers and patterned wiring layers (wiring patterns and circuiting patterns).

Incidentally, the concept of "layer" of the foregoing insulation layers and wiring layers, is not restricted in the thickness.

Further, the wiring substrate include not only a substrate on which semiconductor chips such as LSI and the like and other electronic parts are mounted but also a substrate in the stage before mounting and a substrate on which no electronic part is to be mounted but wirings are to be formed.

BRIEF DESCRIPTION OF THE DRAWINGS

FIG. 2 is a cross-section figure of the wiring substrate of FIG. 1.

FIG. 3 is a figure illustrating the constitution of removing a binder from a conductive paste using a liquid absorption body.

FIG. 10(a) is a cross-section figure illustrating a first process in manufacture of a wiring substrate of a furthermore different embodiment of the present invention.

FIG. 10(b) is a cross-section figure illustrating a second process in manufacture of a wiring substrate of a furthermore different embodiment of the present invention.

FIG. 10(c) is a cross-section figure illustrating a third process in manufacture of a wiring substrate of a furthermore different embodiment of the present invention.

FIG. 10(d) is a cross-section figure illustrating a fourth process in manufacture of a wiring substrate of a furthermore different embodiment of the present invention.

FIG. 10(e) is a cross-section figure illustrating a fifth process in manufacture of a wiring substrate of a furthermore different embodiment of the present invention.

FIG. 10(f) is a cross-section figure illustrating a sixth process in manufacture of a wiring substrate of a furthermore different embodiment of the present invention.

FIG. 10(g) is a cross-section figure illustrating a seventh process in manufacture of a wiring substrate of a furthermore different embodiment of the present invention.

FIG. 10(h) is a cross-section figure illustrating a eighth process in manufacture of a wiring substrate of a furthermore different embodiment of the present invention.

FIG. 10(i) is a cross-section figure illustrating a ninth process in manufacture of a wiring substrate of a furthermore different/embodiment of the present invention.

FIG. 10(j) is a cross-section figure illustrating a tenth process in manufacture of a wiring substrate of a furthermore different embodiment of the present invention.

FIG. 12(a) is a cross-section figure of a step of forming a through hole in a porous substrate to illustrate so-called "paste bleed" in a conventional technique.

FIG. 12(b) is a cross-section figure of a step of overlaying copper foils and thermally press-bonding the foils to illustrate so-called "paste bleed" in a conventional technique.

PREFERRED EMBODIMENTS OF THE INVENTION

FIG. 1 to FIG. 5 show the most preferable embodiments of the present invention.

Figure 1A:
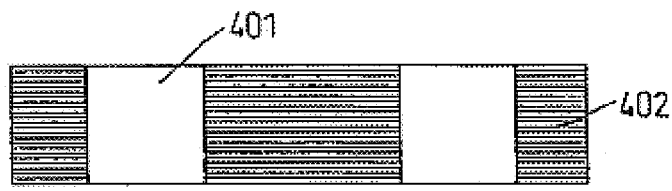
FIG. 1(a) is a schematic cross-section figure of a first process of manufacture of a wiring substrate of the most preferable embodiment of the present invention.

A basic manufacture method of a wiring substrate of an embodiment will be described below At first, as illustrated in FIG. 1(a), a via hole 401 is formed in an insulation substrate (an insulation layer) 402.

Figure 1B:
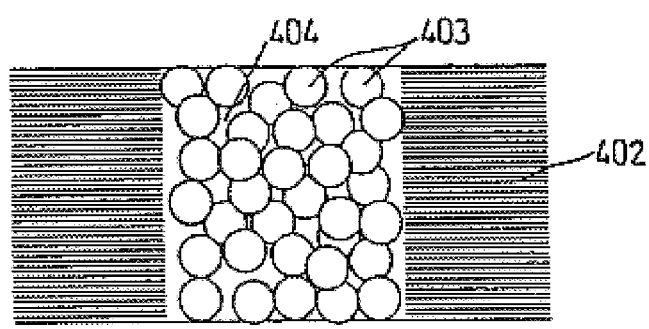
FIG. 1(b) is a schematic cross-section figure of a second process in the foregoing embodiment.

Next, as illustrated in FIG. 1(b) the via hole 401 is filled with a conductive paste containing a conductive filler 403 as a functional substance and at the same time at least some of a binder of the conductive paste is removed to form voids 404 in agglomerates of the conductive filler 403 in the via hole 401, that is, the voids 404 are formed in the surroundings of the particles of the conductive filler 403.

Figure 1C:
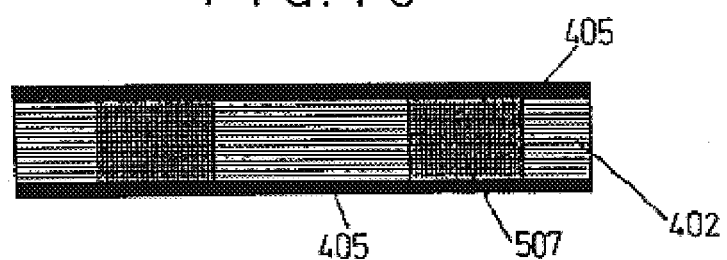
FIG. 1(c) is a schematic cross-section figure of a third process in the foregoing embodiment.

Then, as illustrated in FIG. 1(c), metal foils 405 such as copper foils for forming patterned wirings in both sides are overlaid on both sides and pressurized and laminated and thus the organic resin of the insulation substrate 402 are made to penetrate the foregoing voids 404 to form a via 507.

In this case, the voids 404 in the via 507 are not entirely penetrated with the organic resin of the insulation substrate 402 but some of the voids (first voids) are penetrated with the foregoing organic resin but the remaining voids (second voids) 404' are not penetrated with the foregoing organic resin and positively left as they contain air. In other words, air exists in the second voids 404'.

Incidentally, a gas other than air may exist in the second voids 404'.

Further, the conductive filler 403 contains portions where at least conductive filler particles are agglomerated one another. The second voids 404' are selectively formed in the agglomerated portions in the conductive filler 403 and the average volume of the second voids 404' is made smaller than the average volume of a plurality of respective conductive filler 403 particles forming at least the agglomerated portions.

Incidentally, the agglomeration means the situation where second voids are surrounded with a plurality of conductive filler 403 as to leave voids containing air in the inside.

Figure 1D:
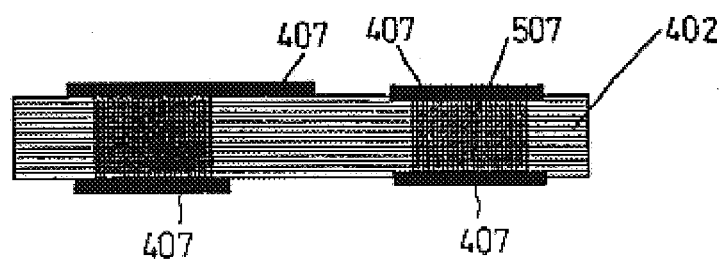
FIG. 1(d) is a schematic cross-section figure of a fourth process in the foregoing embodiment.

Finally, as illustrated in FIG. 1(d), the metal foils 405 in both sides are processed by a photolithographic method to form wiring layers 407 having desired patterns.

In the above described manner, a double-sided wiring substrate illustrated in FIG. 2 can be obtained.

FIG. 2 shows the situation where the organic resin 406 of the insulation substrate 402 penetrates and exists in some of the first voids 404 in the surroundings of the conductive filler 403 formed by removing at least some of the binder of the conductive paste and also second voids 404' (white depleted parts in FIG. 2) are left as they contain air without being penetrated with the organic resin 406.

In the case of this embodiment, the voids 404 are formed in agglomerates of the conductive filler 403 in the via hole 401 by removing at least some of the binder contained in the conductive paste after the via hole 401 is filled with the conductive paste and the organic resin 406 of the insulation substrate 402 are made to penetrate the voids 404, so that so-called "paste bleed" which is penetration of the insulation substrate 402 with the conductive paste can be avoided.

In the case of this embodiment, if only some of the binder contained in conductive paste is removed, the situation is produced where the organic resin component of the insulation substrate 402 and the binder contained in the conductive paste exist in the voids 404 while being mixed or being phase-isolated (island structure).

Hereinafter, a material to be used for the method of manufacturing the wiring substrate will be described.

(A) Insulation Substrate

The insulation substrate is an insulation resin substrate and contains an organic resin.

Any insulation substrate can be employed without any restriction as long as the insulation substrate is capable of electrically insulating the wiring layers of the wiring substrate one another and besides, is capable of penetrating the organic resin in voids of a via hole. That is, any insulation substrate can be employed if the insulation substrate has a constitution with which an organic resin can be fluidized in the manufacturing process of the wiring substrate.

Examples with such a constitution include a sheet-like molded material of a thermoplastic resin and/or a thermosetting resin in the semi-cured state as an organic resin; a composite material (prepreg) composed of a thermosetting resin and/or a thermosetting resin in the semi-cured state and organic or inorganic woven or non-woven cloth or a composite material composed of a thermoplastic resin and/or a thermosetting resin in the semi-cured state and an organic or inorganic filler.

As the thermoplastic and/or thermosetting resin, usable resins are an epoxy resin, a polyimide resin, a phenol resin, a fluoro resin, an unsaturated polyester resin, a PPE (polyphenylene ether) resin, and a cyanate ester resin.

As the organic or inorganic woven or non-woven cloth, usable ones are woven or non-woven cloths made of organic fibers such as PBO (poly-p-phenylenebenzobisoxazole) fibers, PBI (polybenzoimidazole) fibers, aramide fibers, PTFE (polytetrafluoroethylene) fibers, PBZT (poly-p-phenylenebenzobisoxazole) fibers, and all of aromatic polyester fibers and inorganic fibers such as glass fibers. As organic or inorganic filler, usable substances are aluminum hydroxide, aluminum oxide (alumina), silicon dioxide (silica), and silicon nitride.

Practical examples of the insulation substrate composed of these materials are an aramide epoxy substrate, a glass epoxy substrate, and the like.

(B) Conductive Filler/Conductive Paste

A conductive filler is not specifically restricted in the shape for use and a powder, a fibrous filler, a granulated body of a powder, a spherical ball, or their mixture can be used. The size of the filler may be selected to be suitable to fill a via hole according to the purpose of the present invention. That is, those having a particle size approximately same as the diameter of the via hole can be used. Incidentally, in the case of using the conductive filler while granulating it, the filler may be used while being adjusted as to have a size approximately same as the diameter of the via hole after the granulation.

The volume ratio of the filler in the via is preferably 30% or higher since filler particles are easily brought into contact with one another to lower the inter-layer connection resistance.

Practical examples of the conductive fillers are at least one of metals selected from gold, silver, copper, nickel, palladium, lead, tin, indium, and bismuth, their alloys, and their mixture. Further, also usable are coated fillers composed of balls made of the foregoing metals and alloys and oxides such as alumina and silica and organic synthetic resins and coatings of the foregoing metals and alloys.

As the conductive paste, usable ones are those produced by dispersing the foregoing conductive fillers together with, if necessary, an organic resin and/or a binder of a volatile component. The organic resin to be used as the binder includes a liquid epoxy resin, a polyimide resin, a cyanate ester resin, a phenol resol resin, and the like. As the epoxy resin, there are glycidyl ether type epoxy resins such as bisphenol A type epoxy resins, bisphenol F type epoxy resins, bisphenol AD type epoxy resins, and the like; alicyclic type epoxy resins; glycidylamine type epoxy resins; epoxy resins having two or more epoxy groups such as glycidyl ester type epoxy resins; and the like.

As the volatile component, any substance can be employed without restrictions if it can be removed by evaporation after filling or during filling and solvents can be used as such a substance. Examples are butyl cellosolve, ethyl cellosolve, butylcarbitol, ethylcarbitol, butylcarbitol acetate, ethylcarbitol acetate, and α-terpineol.

If necessary, the binder may contain an additive such as a curing agent for the thermosetting resin and a dispersant for improving the dispersion state of the conductive filler.

Next, a method for manufacturing the foregoing wiring substrate will be described in details.

As illustrated in FIG. 1(a), an insulation substrate 402 containing an organic resin and having via holes 401 formed at prescribed positions is made ready. Voids may or may not exist in the insulation substrate 402. The via holes 401 are formed by a general via hole formation method for a wiring substrate, that is, the mechanical drilling processing, the punching processing, the laser processing using carbon dioxide, excimer, YAG laser, plasma etching, photo-via-processing, and the like.

For example, in case of using an aramide epoxy substrate of 120 $\mu$m thickness, via holes of 100 $\mu$m to 250 $\mu$m can be formed by carbon dioxide gas laser of 9.4 $\mu$m to 10.6 $\mu$m wavelength.

Next, the via holes 401 are filled with a conductive paste from the opening parts in one side of the via hole 401.

The filling method to be employed is for example a printing method by squeegee 506 illustrated in FIG. 3 and a method for pressure-injection by a dispenser.

A liquid absorption body 503 is disposed in the opening parts in a manner as illustrated in FIG. 3 on the opposite to the side, in which the conductive paste 508 is injected, so that the absorption body can absorb some of or all of the binder of the conductive paste 508 packed in the via holes 401 simultaneously with or successively to the filling of the via holes 401 with the conductive paste 508 to heighten the loading density (the volume ratio) of the conductive filler 403 as well as to form voids 404 where the binder is expelled in the inside of the via holes 401 as illustrated in FIG. 1(b).

In this case, the binder is sucked in the following conditions until the voids 404 are formed. That is, simultaneously with or after the loading with the conductive paste 508, vacuum suction to 140 to 150 mmHg is carried out. At that time, the voids 404 can be formed in the inside of the via holes 401 in the conditions of 25 to 35 mN/m of the surface tension of the conductive paste 508 (30 to 45 mN/m of the surface tension of the binder resin), 20 [Pa-s] of the viscosity of the conductive paste 508, and 20 to 40 seconds of the suction duration.

However, the conditions are only examples and voids 404 can be formed in other different conditions.

A practical constitution example of the liquid absorption body 503 can be composed, as illustrated in FIG. 3, by mounting an insulation substrate 402 on a vacuum adsorption support 502 and setting the liquid absorption body 503 between them.

A plurality of holes 504 for suction are formed in the vacuum adsorption support 502 and the conductive paste 508 is packed in the side (the upper face side) opposed to the support 502 and the binder of the conductive paste 508 is sucked to the liquid absorption body 503 to form the voids 404 in which the binder is expelled in the inside of the via holes 401.

As the liquid absorption body 503, substances having a large number of capillary tubes such as sheets of thin paper can be used, and with such a material, the voids 404 can efficiently be formed by the effect of the capillarity of the capillary tubes on the binder besides the binder suction effect of the vacuum adsorption support 502.

Additionally, if necessary, if a mask 505 is installed on the insulation substrate 402, the conductive paste 508 can be prevented from adhering to parts other than the via holes 401.

In the next process, as illustrated in FIG. 1(c), metal foils 405 such as copper foils for forming wiring layers 407 having desired patterns are overlaid in both sides and pressurized and laminated.

By the pressure application, the organic resin in the insulation substrate 402 is fluidized and penetrates the voids 404 in the via holes 401. At that time, if necessary, heating is carried out in order to heighten the fluidity of the organic resin or cure the organic resin.

For example, the pressurizing and laminating process may be carried out for the aramide epoxy substrate with the thickness of 120 μm in conditions of 50 kgf/cm², 200° C., for 1 hour while decreasing the ambient pressure to 10 mtorr in case of 100 [Pa-s] of the minimum viscosity of the melt.

Since some or all of the binder in the inside of the via holes 401 is removed to form the voids 404 in the prior process, the fluidity of the conductive paste in the via holes 401 is significantly lowered.

As a result, the phenomenon that the conductive paste flows in the voids 404 even if there exist voids in the insulation substrate 402, so-called "paste bleed", can be eliminated. On the other hand, since the fluidity of the organic resin of the insulation substrate 402 is not changed, the organic resin penetrates the voids 404 existing in the via holes 401.

In this case, as illustrated in FIG. 2, the organic resin from the insulation substrate 402 flows in some of voids 404, that is, the first voids among the voids 404 and the remaining second voids 404' are left as they contain air without being filled with the organic resin. Incidentally, if the binder in the via holes 401 is entirely removed, the organic resin component enters the first voids and if the binder in the via holes 401 is partially removed, the organic resin and the binder resin of the conductive paste enter the first voids while being mixed each other or in phase separated state (in island state).

Further, the conductive filler 403 is in agglomerated state and the second voids 404' are selectively formed in the agglomerated portions of the conductive filler 403.

The average volume of the second voids 404' is made smaller than the average volume of a plurality of respective conductive filler 403 particles forming at least the agglomerated portions.

Finally, as illustrated in FIG. 1(d), the metal foils 405 in both sides are processed by a conventional method, such as a photolithographic method to form wiring layers 407 having desired patterns and to complete a double-sided wiring substrate illustrated in FIG. 2.

In the wiring substrate of this embodiment, as illustrated in FIG. 2, the conductive filler 403 is agglomerated in the via holes 401 and the organic resin from the insulation substrate 402 enters the first voids and the second voids 404' are selectively left as they are in the portions where the conductive filler 403 exists in agglomerated state.

Further, the average volume of the second voids 404' is made to be smaller than the average volume of the conductive filler 403.

According to this embodiment, the wiring substrate obtained is free from paste bleeding and excellent in insulation reliability.

In this case, since the interfaces of the side walls of via holes are removed, the tensile stress caused in the vias and the insulation substrate following the bending of the wiring substrate in the thickness direction and shear stress attributed to the thermal expansion difference and affecting the via and the insulation substrate, the separation (break) of the via holes from the via holes hardly takes place and the insulation substrate is provided with a firm structure. Further, in the case where the organic resin in the via holes and the organic resin of the insulation substrate are the same material, the structure becomes for firm and the thermal expansion coefficients of the organic resins are approximately same to improve the connection reliability.

Further, in this embodiment, only some of voids 404 in the via 507 are filled with the organic resin but the voids 404 are not all filled with the organic resin and the second voids 404' having the smaller average volume than the average volume of the conductive filler are positively left selectively in the agglomerated portions of the conductive filler while containing air, so that the elasticity modulus is lowered and the excellent flexibility is improved.

For that, even if the mechanical stress is applied to the wiring substrate by heat, the expansion and the contraction of the entire body of the wiring substrate easily follow the stress and the wiring substrate is provided with high reliability in the electric and mechanical connection between neighboring upper and lower patterns.

In this case, although the agglomerated portions of the conductive filler 403 themselves have a high elasticity modulus, the second voids 404' are left selectively in agglomerated portions of the conductive paste having the high elasticity modulus, so that the elasticity modulus in the agglomerated portions where the second voids 404' exist can be lowered.

The following two methods, for example, are available to selectively leave the voids.

One method comprises the process of forming agglomerated portions of the conductive filler and the portions where no agglomeration takes place by incompletely dispersing the conductive filler of the conductive paste and finishing the dispersion while leaving agglomerate to a certain extent at the time when the conductive paste is produced using a dispersing and mixing apparatus.

For example, in case of mixing 87.5% by weight of a copper powder of about 5 μm average particle size as a conductive filler is dispersed in 12.5% by weight of an epoxy resin by three rolls, if the gaps among the rolls is controlled to be about 10 μm and 5 passes are performed, the mixture is made to be a paste while keeping the network of the copper powder without completely dissociating the agglomerates of the copper powder particles.

Consequently, even during the work of vacuum degassing and loading the conductive paste, degassing hardly takes place in the remaining voids surrounded with the agglomerated portions of the conductive filler and further even in case of penetrating voids with the organic resin in the process thereafter, the organic resin hardly penetrates the voids surrounded with the agglomerated portions of the conductive filler and easily penetrates the voids which are not surrounded with the agglomerated portions. As a result, the voids are selectively left.

The other method comprises the process of adding a curing agent for curing a thermosetting resin together with a conductive filler and the thermosetting resin in a conductive paste and using a powder as the curing agent.

If a powder curing agent having a particle size bigger than that of the conductive filler is used, the conductive filler is forced to exist locally in the conductive paste. Hence, by sucking the resin and the curing agent, the conductive paste is provided with agglomerated portions of the conductive filler and the portions where no agglomeration takes place.

Thus, voids surrounded with the agglomeration parts are hardly penetrated with the organic resin and the voids which are not surrounded with the agglomeration parts are easily penetrated with the organic resin. As a result, voids containing air are selectively left.

Incidentally, even if a conductive powder is used in place of the conductive paste, the voids can selectively be left in the same manner as described above.

In this case, the conductive filler is not even in the via but exists while being agglomerated to a certain extent. That is a common technique to keep conductivity since if the conductive filler is dispersed too evenly, the contact among conductive filler particles is eliminated to result in deterioration of the conductivity.

For that, the connection reliability can be improved without deteriorating the conductivity by selectively forming the voids in the portions, which are the agglomeration parts of the conductive filler and have the highest elasticity modulus in via, in other words, forming the voids which are in agglomeration parts and hardly penetrated with the organic resin.

Incidentally, in case of positively leaving second voids having the smaller average volume than the average volume of respective conductive filler particles, a large amount of the conductive filler can exist and mechanical and electric connection of the conductive filler particles are made excellent.

Further, since the second voids are surrounded with a plurality of conductive filler particles in agglomerated state where they are firmly connected to each other, the second voids are hardly crushed and left at high ratio and consequently the wiring substrate obtained is provided with a preferable constitution where a low elasticity modulus can be maintained for a long duration, that is, the electric and mechanical connection reliability of the upper and lower wiring layers can be maintained for a long duration.

Incidentally, although as described above, the manner is exemplified using a powder curing agent, the same effects can be obtained by using resin balls, a resin powder, a ceramic powder and the like with a large particle size than that of the conductive filler.

Further incidentally, although the description is give using copper foils as the metal foils 405 for forming wiring layers 407, any metal foil 405 capable of forming wiring layers 407 can be employed without any particular restriction. As the metal foil 405, for example, aluminum can be employed. Also as the copper foil, a rolled copper foil and an electrolytic copper foil, which are commonly used for wiring substrates, can be used.

Also, although this embodiment is described by employing a method for removing some of the binder of the conductive paste 508 by absorbing it with the liquid absorption body 503 as an example of the process for forming the voids 404 in the via holes 401, there is another method available using a conductive paste 508 containing a volatile component for forming the voids 404 evaporating the volatile component of the conductive paste 508 after the step of filling the via holes 401 with conductive paste 508 or during the step of filling the via holes 401 with conductive paste 508. The evaporation of the volatile component can be carried out by a heat drying or vacuum/pressure a decrease drying method.

Figure 4A:
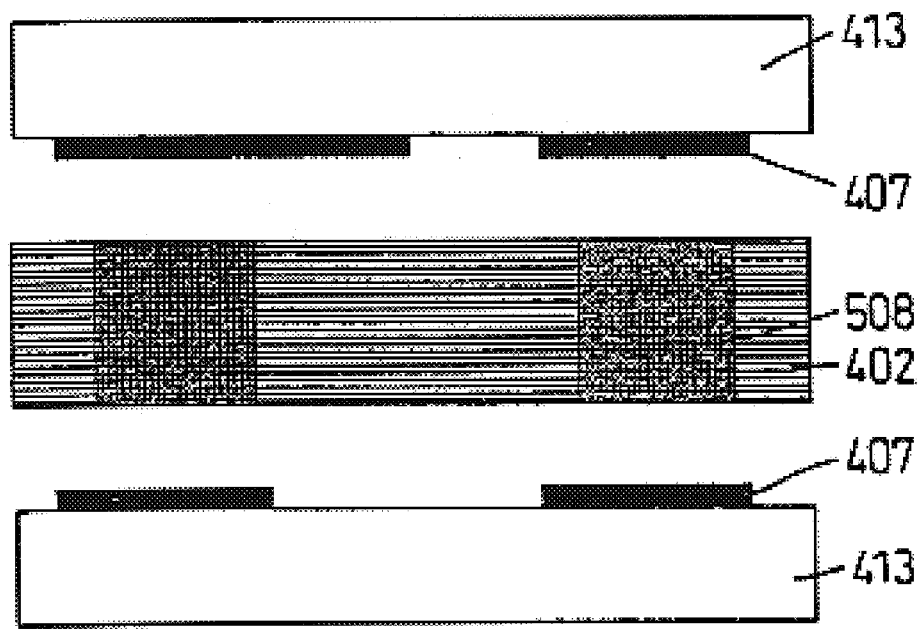
FIG. 4(a) is a cross-section figure illustrating a first process of manufacture of a double-sided wiring substrate by a transfer method.
Figure 4B:
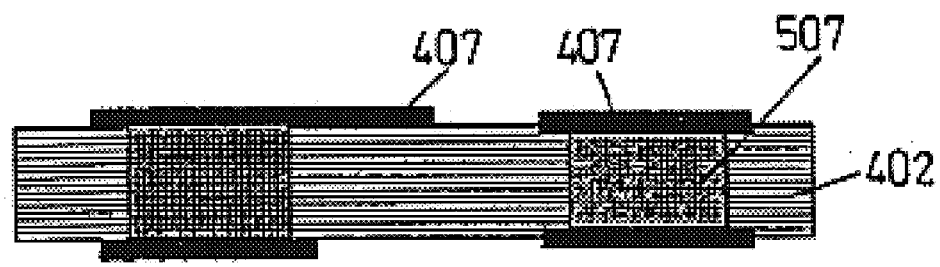
FIG. 4(b) is a cross-section figure illustrating a second process of manufacture of a double-sided wiring substrate by a transfer method.

Although the formation of the wiring layers 407 is described in this embodiment as to be carried out by overlaying metal foils 405 such as copper foils on both sides and then processing the metal foils 405, there is another method applicable, as illustrated in FIG. 4, which comprises steps of overlaying metal foils 405 in which the wiring layers 407 are previously formed on the insulation substrate 402 in which via holes 401 are so formed as to have voids 404 by removing at least some of the binder of the conductive paste 508 and then pressurizing the metal foils 405.

More particularly, the above described method is so-called a transfer method in which metal foils formed on supporting bodies 413 are processed to be wiring layers 407 and being united with the supporting bodies 413, the metal foils are so overlaid on the insulation substrate 402 as to bring the wiring layers 407 into contact with the insulation substrate 402 and then pressurized and then the wiring layers 407 are transferred by removing only the supporting bodies 413 by an etching or mechanically separating method.

Figure 5A:
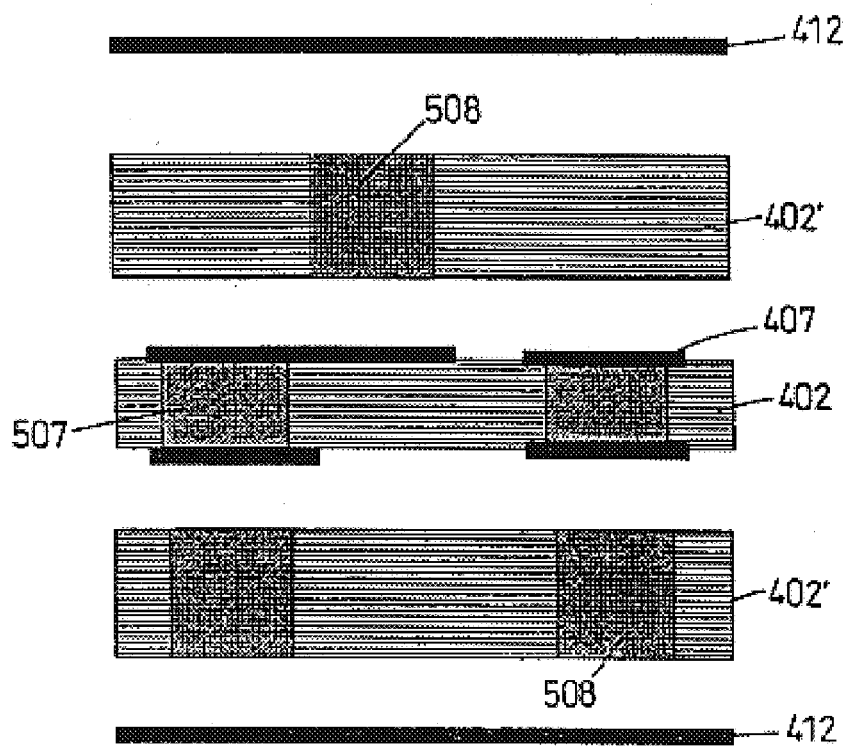
FIG. 5(a) is a cross-section figure illustrating a first process of manufacture of a four-layer type wiring substrate.
Figure 5B:
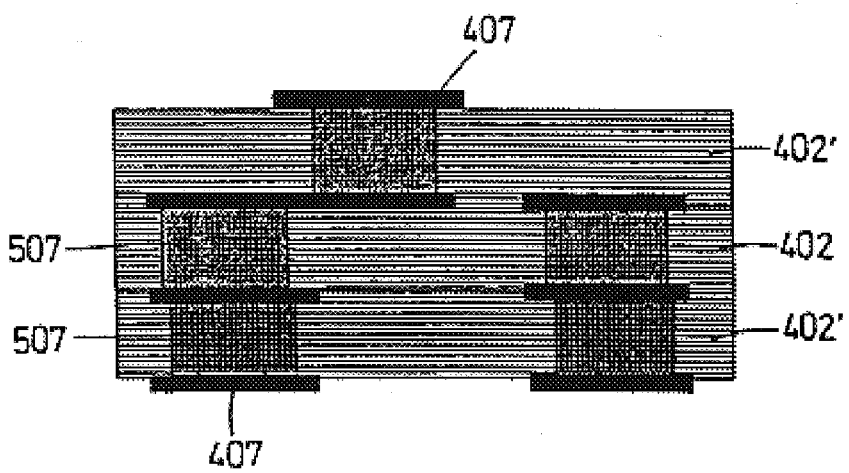
FIG. 5(b) is a cross-section figure illustrating a second process of manufacture of a four-layer type wiring substrate.

A four-layer insulation substrate as an example of a multi layer wiring substrate of an embodiment of the present invention can be produced, as illustrated in FIG. 5, by overlaying insulation substrates 402' in which via holes are so formed as to have voids therein by removing at least some of the binder of the conductive paste 508 and further metal foils 412 such as copper foils on the outsides of substrates 402' on both sides of a double-sided wiring substrate as described above [FIG. 1(d) and FIG. 4(b)] or on both sides of a conventionally used both-sided wiring substrate and pressurized and laminated together with the double-sided wiring substrate and then processing the metal foils 412 such as copper foils into wiring layers 407 to obtain the four-layer wiring substrate as illustrated in FIG. 5(b). By repeating such processes, a further multi layer wiring substrate can be obtained.

Incidentally, although the description is given as an example of a method of manufacturing the foregoing multi layer wiring substrate by using insulation substrates 402' in both sides of the double-sided wiring substrate, it is possible to use a multi layer wiring substrate having 2 or more layers in place of the double-sided substrate.

In case of using a multi layer substrate, different types of insulation substrates (insulation layers) may be laminated. For example, using glass-epoxy substrates, one or a plurality of layers of circuits can be formed in one or both sides of a double-sided or multi layer wiring substrate produced from an aramide-epoxy substrate.

Figure 6A:
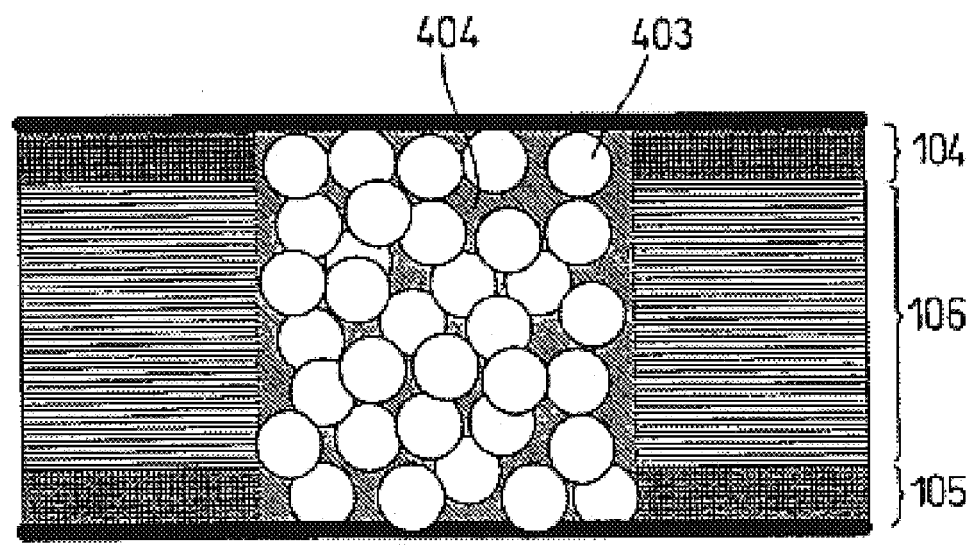
FIG. 6(a) is a cross-section figure of a wiring substrate in which a resin penetrates the entire voids, relevant to another embodiment of the present invention.
Figure 6B:
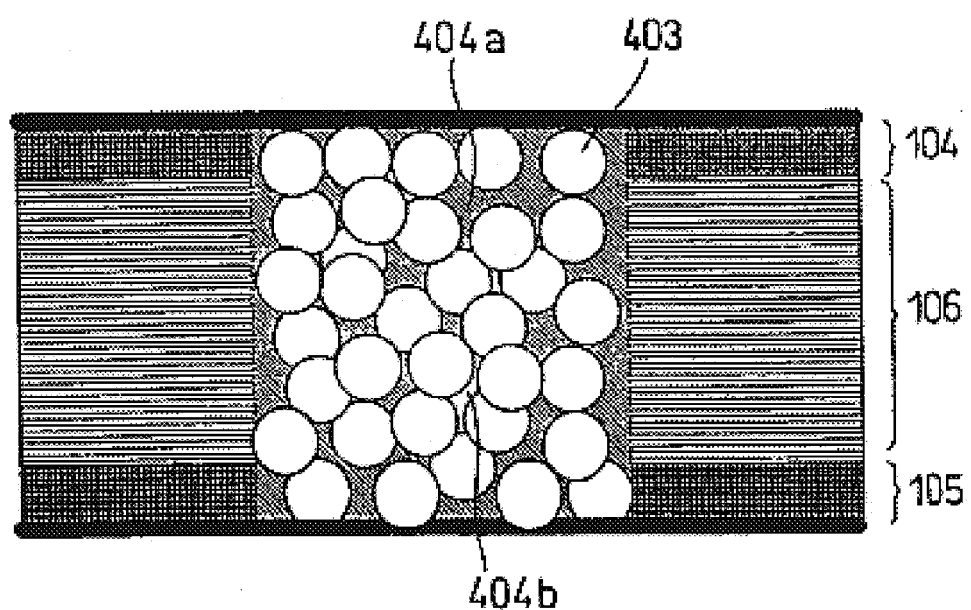
FIG. 6(b) is a cross-section figure of a wiring substrate in which some voids are left as compared with that in FIG. 6(a).

Another Embodiment (i) In another embodiment of the present invention as illustrated in FIGS. 6(a) and 6(b), a wiring substrate is produced in the same manner as described in the former embodiment except that the wiring substrate is produced using a film 106 (including a sheet, hereinafter refereed as to a film) on both sides (optionally, one side) of which adhesive layers 104 and 105 containing an adhesive are formed.

In case of the wiring substrate as illustrated in FIG. 6(a), some of the adhesive contained in the adhesive layers 104 and 105 enters and exists in the voids 404 existing in the surroundings of the agglomerates of the conductive filler 403 in the via holes.

In this case, the voids, as illustrated in FIG. 6(b), may include some first voids 404a filled with the adhesive and the remaining second voids 404b containing air without being filled with the adhesive and owing to that, excellent flexibility is provided and even if mechanical stress is applied to the wiring substrate by heat in the thickness direction, the entire wiring substrate is made easy to be expanded and contracted corresponding to the stress to give a high reliability in connection of the upper and lower wiring layers. The second voids 404b in this embodiment may also be smaller than the particle size of the conductive filler 403 in the same reason as described above.

In this case, the film 106 as an insulation substrate is so composed as to have the adhesive layers 104 and 105 in one or both sides.

The adhesive layers 104 and 105 are formed using at least a thermosetting resin and/or a thermoplastic resin, more particularly an epoxy type adhesive, an imide type adhesive, a silicon type adhesive and the like. In case of using the thermosetting resin as an adhesive, it is preferable for the thermosetting resin to be kept in a semi-cured state since it can be fluidized.

The film 106 may be an organic sheet produced from a synthetic resin such as polyimides, BCB (benzocyclobutene), PTFE (polytetrafluoroethylene), aramides, PBO (polyparaphenylenebenzobisoxazole), and entire aromatic polyesters.

Also for the film 106, an insulation substrate produced by forming an adhesive layer on both sides or one side of a glass-epoxy substrate or a ceramic substrate, which is commonly used as an insulating material for a wiring substrate, can be used as an insulation layer.

Regarding other materials, they are the same as described in the foregoing embodiment.

However, as the adhesive layers 104 and 105, films may be formed by applying a THF (tetrahydrofuran) solution containing a polyimide type adhesive (30% by weight on the basis of solid matter) to both sides of a polyimide film of 13 μm thickness and after that, drying the adhesive at 120° C. to obtain an insulation substrate bearing the adhesive layers with each 5 μm thickness in semi-cured state and then laminating PEN (polyethylene terephthalate) films of 9 μm in thickness on both sides, temporarily pressure-bonding under the condition at 80° C. and 2 kgf/cm², and after that parting the PEN films. The lowest viscosity of the melt of the adhesive in the film is about 1000 Pa-s at 130° C.

The PEN films may be left as they are as cover films.

Figure 7A:
FIG. 7(a) is a schematic cross-section figure of a first process of manufacture of a wiring substrate illustrated in FIG. 6.
Figure 7B:
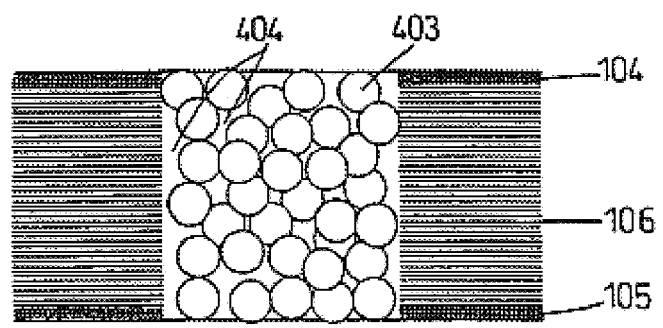
FIG. 7(b) is a schematic cross-section figure of a second process of manufacture of a wiring substrate illustrated in FIG. 6.
Figure 7C:
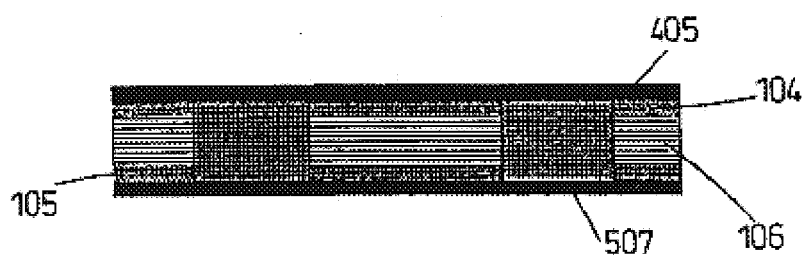
FIG. 7(c) is a schematic cross-section figure of a third process of manufacture of a wiring substrate illustrated in FIG. 6.
Figure 7D:
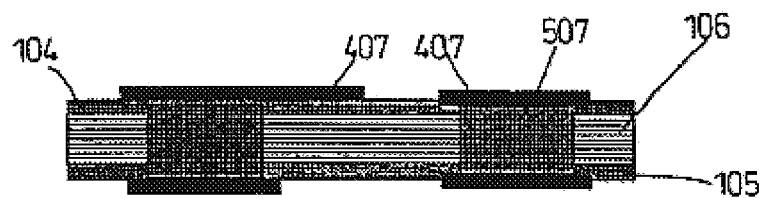
FIG. 7(d) is a schematic cross-section figure of a fourth process of manufacture of a wiring substrate illustrated in FIG. 6.
Figure 8A:
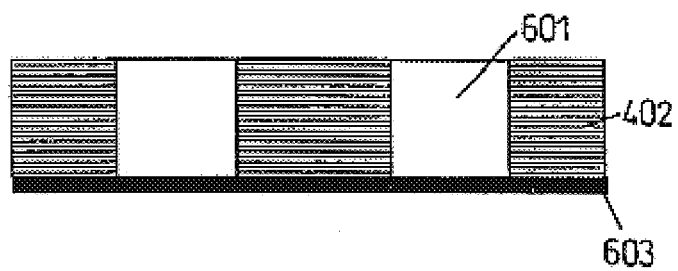
FIG. 8(a) a cross-section figure illustrating a first process in manufacture of a wiring substrate of a further different embodiment of the present invention.
Figure 8B:
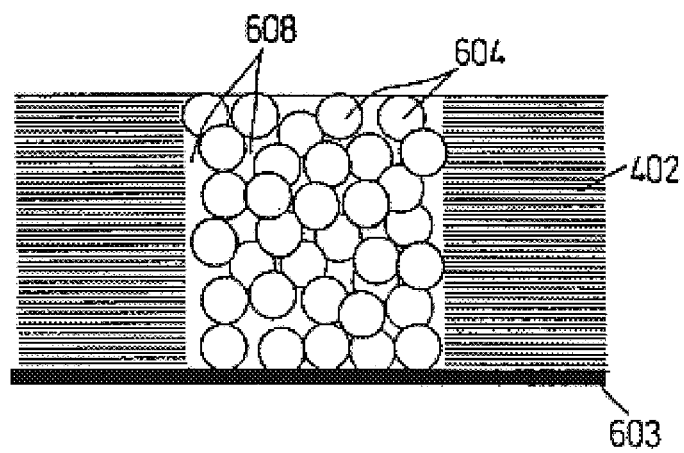
FIG. 8(b) is a cross-section figure illustrating a second process in manufacture of a wiring substrate of a further different embodiment of the present invention.
Figure 8C:
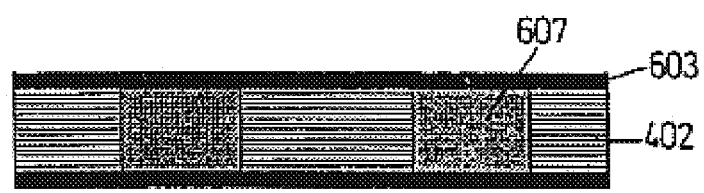
FIG. 8(c) is a cross-section figure illustrating a third process in manufacture of a wiring substrate of a further different embodiment of the present invention.
Figure 8D:
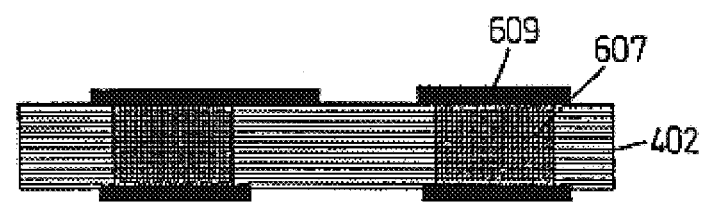
FIG. 8(d) is a cross-section figure illustrating a fourth process in manufacture of a wiring substrate of a further different embodiment of the present invention.

The method of manufacturing the wiring substrate of this embodiment is basically same as described in the foregoing embodiment and comprises processes of forming via holes 401 in an insulation layer of a film (or a sheet) 106 bearing adhesive layers 104 and 105 in both sides, as illustrated in FIG. 7(a); filling the via holes 401 with a conductive paste containing a conductive filler 403 and at the same time removing at least some of the binder of the conductive paste by suction in the same manner as described in the foregoing embodiment to form voids 404 in agglomerates of the conductive filler 403 in the via holes 401, as illustrated in FIG. 7(b); overlaying metal foils 405 such as copper foils for forming patterned wirings in both sides on both sides, as illustrated in FIG. 7(c), and pressurizing and laminating the metal foils 405 to thus penetrate the voids 404 with the adhesive of the adhesive layers 104 and 105 in both sides, and finally forming the wiring layers 407 by processing the copper foils in both sides by a photolithographic method and the like, as illustrated in FIG. 7(d), to obtain a double-sided wiring substrate. Incidentally, in the case where only some of the binder contained in the conductive paste is removed in the same manner as described in the foregoing embodiment, the adhesive of the adhesive layer 104 (or the adhesive layer 105) and the binder contained in the conductive paste exist together in the voids 404 while being mixed with each other or being phase separated state (in island structure). Further, in the case where only some of the binder contained in the conductive paste is removed, a slight amount of the binder contained in the conductive paste sometimes penetrates the adhesive layers in the process of overlaying and pressurizing and laminating the metal foils 405 such as copper foils for forming wiring layer in both sides.

Additionally, in this embodiment, a method to be employed as the via hole formation method comprises step of forming holes of 20 to 70 μm size by radiating 40 shots of laser beam of 355 μm wavelength for every via hole by triple harmonics UV-YAG laser.

Further in addition, in the case where the adhesive layer is formed only in one side, it corresponds to the case where the adhesive layer 104 (or 105) does not exist.

In this embodiment, the adhesive of the adhesive layers 104 and 105 penetrates the voids 404 of the via holes 401.

Although an insulation substrate of a film or a sheet does not have compressibility, the loading density (the volume ratio) of the conductive filler 403 can be heightened in the process of removing the binder of the conductive paste 507, so that a high conductivity (a low connection resistance) can reliably be maintained.

According to this embodiment, paste bleed is not at all caused and the obtained wiring substrate is provided with reliability in the insulation between the wiring layers 407 on both sides and reliability in electric and mechanical connection between the wiring layers 407 in both sides.

The reliability in the connection will be described more particularly.

A high heat resistant insulation substrate of the next generation, such as a polyimide, a liquid crystal polymer, an aramide film, and the like usable as the film 106 is hardly adhesive from the point of the molecular structure. On the other hand, the insides of the via hole 507 are made firm being formed by surrounding the skeletal structures of the conductive filler 403 with the organic resin. Moreover, since the binder in the conductive paste is required to have properties of the handling convenience and the fluidity in order to fill the via holes with, it is extremely difficult to make the binder same as the adhesive. Attributed to such matter, separation easily takes place in the interface of the adhesive layers 104, 105 and the film 106.

To deal with such separation, in this embodiment, voids 404 are formed in the via 507 by the agglomerates of the conductive filler 403 and the adhesive of the adhesive layers 104, 105 penetrates the voids, so that no clear interface exist between the via 507 and the adhesive layers 104, 105. Therefore, separation hardly takes place in the interfaces of the via 507 and the adhesive layers 104, 105 and the reliability in the connection can be heightened. In this case, even if separation takes place in the interfaces of the adhesive layers 104, 105 and the film 106, the separation does not reach the wiring layers 407 and even if it takes place, it is within the via 507 and the reliability in the connection can be maintained.

Further, the same effect as described in the foregoing embodiment can be obtained. That is, since there is no clear interface between the via 507 and the adhesive layers 104, 105, separation between the via 507 and the adhesive layers 104, 105 is hardly caused by the tensile stress caused between the via hole and the adhesive layers 104, 105 by bending the wiring substrate in the thickness direction and the shear stress owing to the thermal expansion difference between the via 507 and the insulation substrates (the adhesive layers 104, 105 and the film 106) and the wiring substrate is provided with a firm structure. Further, in case of using same organic resin for the organic resin in the via holes and the organic resin of the insulation substrates, the structure is further made firm and the connection reliability is improved due to the approximately same thermal expansion coefficient.

Further, since the film 106 forming the insulation layers has high size precision, higher mounting density is made possible.

Incidentally, also in this embodiment, as same in the foregoing embodiment, the voids 404 may be formed using the conductive paste containing a volatile component by evaporating the volatile component after the via holes 401 are filled with the conductive paste or during the step of filling the via holes 401 with the conductive paste. Further, the formation of the wiring layers 407 may be carried out by the above described transfer method as illustrated in FIG. 4 and moreover a multi layer wiring substrate can be obtained in the same manner as the foregoing embodiment.

Incidentally, in this embodiment, holes of 20 μm to 70 μm size are formed as the via holes 401 by triple harmonics UV-YAG laser with 355 nm wavelength. One via hole 401 is formed by radiating 40 shots of laser beam.

Incidentally, in this embodiment, in the same manner as in the embodiment which will be described later, a conductive powder may be used in place of the conductive paste.

(ii) The method for manufacturing a wiring substrate of another different embodiment of the present invention will be described below. As illustrated in FIG. 8(*a*), an insulation substrate 402 having blind via holes 601 opened only in one side at desired positions and containing an organic resin is made ready.

In this case, the insulation substrate 402 may or may not contain voids.

The method for producing such an insulation substrate 402 may be carried out by employing a common blind via hole formation method for a wiring substrate, that is, laser hole-formation processing by carbon dioxide gas, excimer, YAG laser, plasma etching or photo hole-formation processing to form the blind via holes at desired positions of the insulation substrate 402 bearing a metal foil 603 such as a copper foil in the whole surface of one side and then processing the metal foil 603 to be a wiring layer 609.

Next, as illustrated in FIG. 8(*b*), the foregoing blind via holes 601 are filled with one or a plurality of, that is, one or more conductive filler particles (conductive particles) 604. Although the form of the conductive filler particles 604 is not particularly restricted as long as the particles leave voids 608 in the blind via holes 601, a granulated powder or one conductive particle with approximately the same diameter as that of the openings of the blind via holes 601 are preferable since it is easy to be handled and free from the problems of such as powder dust.

As the filling method applicable is the same method (a printing method) as described in the foregoing embodiment by pushing the filler from the upper sides of the opened parts by a squeegee or a roller.

In the next process, the metal foil 603 for forming a wiring layer 609 is overlaid on the side where the blind via holes 601 are formed and pressurized and laminated as illustrated in FIG. 8(*c*). By the pressure application, the organic resin of the insulation substrate 402 is fluidized and penetrates the voids 608 in the blind via holes 601 to complete the via 607. In this case, if necessary, heating may be carried out in order to heighten the fluidity of the organic resin or harden the organic resin.

In this embodiment, the voids 608 previously exist in the via and the loading density of conductive filler particles 604 is high and no binder is used, so that the fluidity is extremely low as compared with that of a substrate resin and consequently, even if there exist voids in the insulation substrate 402, so-called paste bleed, which is a phenomenon of the paste flowing to the voids, can be eliminated.

On the other hand, since the fluidity of the organic resin of the insulation substrate 402 is not changed, the resin penetrates the voids 608 existing in the via hole 607.

Finally, the metal foil 603 in both sides are processed in the same manner as that in the foregoing embodiment to form the wiring layers 609 and complete the double-sided wiring substrate as illustrated in FIG. 8(*d*).

A method applicable for forming the wiring layers is the transfer method same as that in the foregoing embodiment.

As another embodiment of the blind via hole formation method, the blind via holes may be formed by disposing a previously patterned wiring layer in place of the lamination of the metal foil and then carrying out the transfer method as described in the foregoing embodiment.

Further, the blind via holes may be formed by arranging the wiring substrate of the present invention described in the foregoing embodiment or a commonly used wiring substrate in one side of an insulation substrate and then forming the via holes. Also, in the formation order of the blind via holes, the via holes (through via holes) as described in the foregoing embodiment are previously formed and then the copper foil is laminated to one side of the insulation substrate or a previously formed wiring layer is arranged and layered while being conformed with the via holes.

As the conductive filler loading method, other than the exemplified method of this embodiment, any method can be employed with any restrictions if the method is capable of filling via holes at a high density. For example, a method applicable comprises steps of dispersing the conductive filler on an insulation substrate and vibrating the substrate to fill the via holes.

Figure 9A:
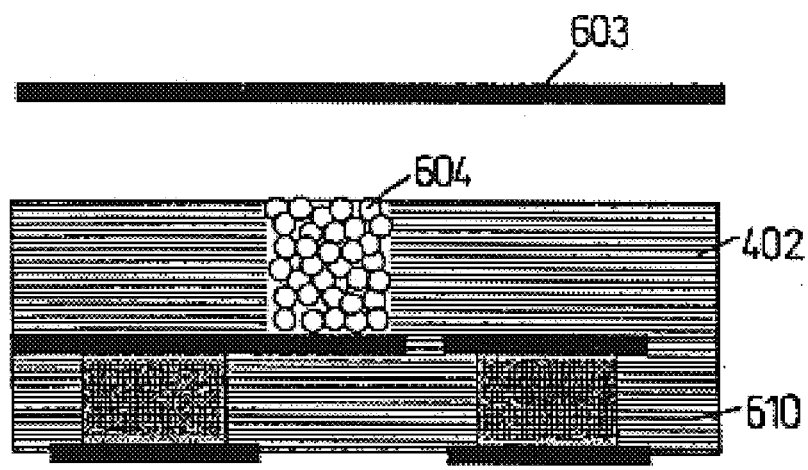
FIG. 9(a) is a cross-section figure of a first process in manufacture of a multi layer wiring substrate.
Figure 9B:
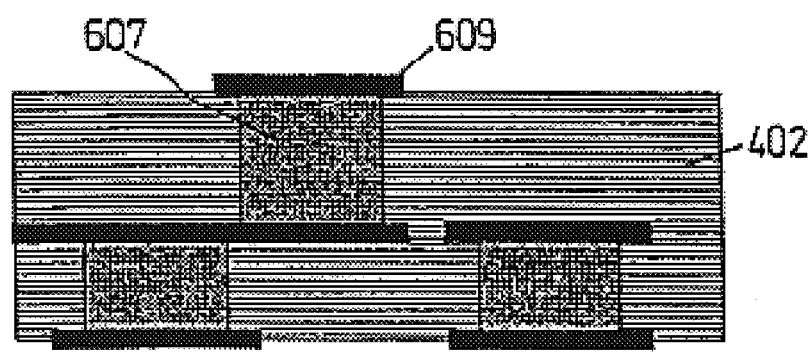
FIG. 9(b) is a cross-section figure of a second process in manufacture of a multi layer wiring substrate.
Figure 11A:
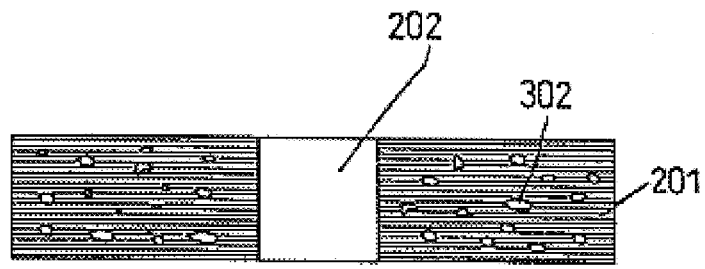
FIG. 11(a) is a cross-section figure illustrating a first process of manufacture of a conventional wiring substrate.
Figure 11B:
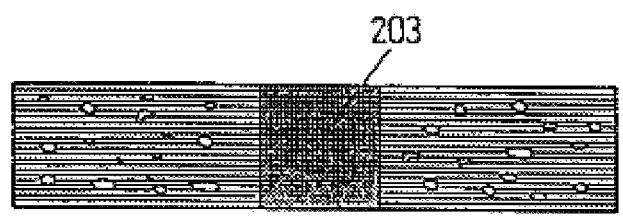
FIG. 11(b) is a cross-section figure illustrating a second process of manufacture of a conventional wiring substrate.
Figure 11C:
FIG. 11(c) is a cross-section figure illustrating a third process of manufacture of a conventional wiring substrate.
Figure 11D:
FIG. 11(d) is a cross-section figure illustrating a fourth process of manufacture of a conventional wiring substrate.

Further, in the case where the wiring substrate is required to be multi-layered, as illustrated in FIGS. 9(*a*), 9(*b*), such a multi layer wiring substrate can be manufactured by layering the wiring substrate as illustrated in FIG. 8(*d*) on the wiring substrate of the present invention illustrated in FIG. 1(*d*) or on a common wiring substrate 601 by a method described in this embodiment with the reference to FIGS. 8(*a*) to 8(*d*). Especially, according to this embodiment, one wiring substrate is produced and then an insulation substrate is laminated thereon and the via holes are formed to manufacture the wiring substrate, so that the positioning is made easy.

By this embodiment, a wiring substrate completely free from paste bleed and excellent in insulation reliability can be obtained.

In this case, since no interface of the side walls of the via holes is formed, separation (break) of the side walls of the via holes is hardly caused by the tensile stress caused between the via and the insulation substrate by bending the wiring substrate in the thickness direction and the shear stress owing to the thermal expansion difference between the via and the insulation substrates and the wiring substrate is provided with a firm structure. Further, in case of using same material for the organic resin in the via holes and the organic resin of the insulation substrate, the structure is further made firm and the connection reliability is improved due to the approximately same thermal expansion coefficient.

Incidentally, also in this embodiment, in place of the loading with the conductive filler, a conductive paste may be used to fill with as same in the foregoing embodiment.

In case of loading the conductive paste, a gap through which at least a paste binder can pass is kept at the time when the wiring pattern forming closed parts of the blind via holes or the metal foil for forming the wiring pattern is disposed and the binder may be discharged to the outside of the via through the gap. For example, a surface-roughened metal foil is so positioned as to keep the surface-roughened side in the via hole side and temporarily pressure-bonded as to leave a gap to the extent in which the roughened parts are not completely buried in the organic resin. If the via holes are loaded with the conductive paste through the opening parts in such a state and thermal press is carried out, the excess binder remaining in the via is discharged out the via by the pressure of the thermal press and the capillarity and the organic resin (the adhesive) of the insulation layer is made easy to flow in the gap among the conductive powder particle and that is therefore preferable. Some of the binder may remain between the surface-roughened metal foil and the insulation layer.

Further, in the case where only some of the binder contained in the conductive paste is removed in the same manner as that in the foregoing embodiment, the same effect as described in the foregoing embodiment can be obtained owing to the existence of the organic resin component contained in the insulation substrate and the binder contained in the conductive paste in the voids of the via in the mixed state or in the phase-isolated state (in island structure).

Further, also in this embodiment as same in the foregoing embodiment, the same effect can be achieved even in the state where the voids in the via are not completely filled and a gas is left in some portions in the conductive filler-agglomerated parts in the via holes.

(iii) A method for manufacturing a wiring substrate of furthermore different embodiment of the present invention will be described below.

In this embodiment, a double-sided wiring substrate is manufactured in the same manner as the foregoing embodiment (ii) except that a film (or a sheet) bearing an adhesive layer in one or both sides in place of the insulation substrate 402 of the foregoing embodiment (ii).

In this case, a part of the adhesive layer penetrates the voids of the blind via hole. Although a film or a sheet does not have compressibility, the loading density (the volume ratio) of the conductive filler 403 can be heightened since no binder of a conductive paste exist, so that high conductivity (a low connection resistance) can reliably be maintained.

According to this embodiment, paste bleed is not at all caused and the obtained wiring substrate is provided with reliability in the insulation and high conductivity (a low connection resistance).

Additionally, also in this embodiment, a conductive paste may be employed for filling in the same manner as the foregoing embodiment in place of the conductive filler employed for filling.

In this embodiment, an example of manufacture of a wiring substrate using a conductive paste will be described with reference to FIGS. 10(a) to (j).

At first, as illustrated in FIG. 10(a), in a film 100b bearing an adhesive 100a in both sides (an insulation layer 100 is composed of the adhesive and the film) as illustrated in FIG. 10(a), a cover film 101 and a wiring-patterned film 102 bearing a carrier are temporarily pressure-bonded to one side and to the other side, respectively, as illustrated in FIG. 10(b).

As an example, after a THF (tetrahydrofuran) solution containing a polyimide type adhesive (30% by weight on the basis of solid matter) is applied to both sides of a polyimide film of 13 μm thickness and after that, the applied adhesive is dried at 120° C. to obtain a film 100b bearing the adhesive layers with each 5 μm thickness in semi-cured state and then a cover film 101 (a PEN film: 9 μm thickness) and a wiring-patterned film 102 bearing a carrier are temporarily pressure-bonded to one side and to the other side, respectively, to obtain a film to be used.

The temporarily pressure-bonding conditions may be controlled to be at 80° C. and 2 kgf/cm$^2$.

A copper foil bearing a carrier for a transfer method on which a wiring pattern is formed can be employed for the wiring pattern 102a of the film 102.

A surface-roughened copper foil having the roughened surface is used for the copper foil bearing the carrier and is preferably pressure-bonded while leaving a gap to the adhesive layer. That is preferable because the resin of the conductive paste can be discharged through the gap and the excess binder remaining in the via can be discharged out the via at the time of pressing and the adhesive (an organic resin) composing the foregoing insulation layer 100 is made easy to flow in the voids among the conductive powder particles.

Next, as illustrated in FIG. 10(c), blind via holes 103 are formed in the insulation layer 100 and the blind via holes 103 are filled with the conductor 104 and then the cover film 101 is removed.

Consequently, a double-sided wiring transferring intermediate body 105 is completed.

Formation of the blind via holes 103 can be carried out employing a hole processing by laser.

As an example, UV-YAG laser (triple harmonics: wavelength 355 nm: by 40 shots) can be employed.

It is preferable to employ the laser since fine blind via holes (in case of this embodiment, the size of 20 to 70 μm) can be formed without damaging the foregoing copper foil bearing the carrier.

As the conductor 104, a conductive paste may be used.

The blind via holes 103 are filled with the conductive paste by a squeegee or the like and after or the during the filling process, the volatile component contained in the conductive paste is removed. For example, after the blind via holes 103 are filled with the conductive paste by a squeegee, the film is put in a pressure decreased chamber and the pressure of the pressure decreased chamber is lowered to 30 Pa to 100 Pa to evaporate the foregoing volatile component. In such a manner, voids from which the volatile component is eliminated can be formed among the conductive filler particles.

Incidentally, a via is defined as the state where a blind via hole 103 is filled with the conductive paste.

The advantage of the void formation by decreasing the pressure is that, as compared with the case of using a thermosetting resin, the curing of the resin is promoted to some extent by heating even if the heating temperature is not higher than the curing temperature of the resin and thus careful control of the conditions of such as the temperature is required, such careful control is not required in case of decreasing the pressure and consequently via hole in which voids exist can easily be formed.

Next, as illustrated in FIG. 10(d), a metal foil 106 is overlaid on the side, from which the cover film 101 is removed, of the double-sided wiring transferring intermediate body 105 and then heated and pressurized by a thermal press.

At that time, the wiring pattern 102a is buried in the adhesive 100a and the adhesive 100a flows in the foregoing voids formed among the conductive filler particles by eliminating the volatile component.

In this case, if the wiring pattern 102a is made of the roughened copper foil whose surface is roughened, the resin of the conductive paste can be discharged out through the gap left between the pattern and the adhesive 102 and the excess binder remaining in the via hole is discharged outside of the via and thus the adhesive 100a is made easy to flow in the voids among the conductive powder particles.

The conditions of the thermal press may be controlled to be, for example, at 150 kgf/cm$^2$ pressure and 200° C. for 1 hour in the decreased pressure of 10 mtorr.

Next, as illustrated in FIG. 10(e), the metal foil 106 is processed to be a wiring pattern 106a by a conventional photolithographic method.

In such a manner, a double-sided wiring transferring material 108 can be completed.

After that, a double-sided wiring substrate can be completed by removing the carrier from the double-sided wiring transferring material 108.

A multi layer wiring transferring intermediate body 109 can be manufactured by repeating the foregoing process using the double-sided wiring transferring material 108 in place of the metal foil bearing a carrier as illustrated in FIG. 10(f).

After that, a multi layer wiring substrate 110 can be completed by removing the carrier from the multi layer wiring transferring intermediate body 109 as illustrated in FIG. 10(g).

Although the example is described using the polyimide film as the insulation layer, also usable are those produced by applying the adhesive to other films such as BCB (benzocyclobutene), PTFE (polytetrafluoroethylene), aramides, PBO (polyparaphenylenebenzobisoxazole), and entire aromatic polyesters.

In case of a thermoplastic film, since the film itself has an adhesive property by heating, the film can be used without an adhesive.

In another embodiment of a multi layer wiring substrate, as illustrated in FIG. 10(h), a previously produced wiring substrate (either a wiring substrate of the present invention or a commonly wiring substrate may be usable) is used as a core substrate 111 and the multi layer wiring transferring intermediate body 109 is overlaid in at least one side of the core substrate 111 as illustrated in Fig. and laminated by thermal press.

The conditions of the thermal press may be controlled as, for example, at 50 kgf/cm$^2$, 200° C. for 1 hour in the pressure decreased to 10 mtorr.

Finally, the carrier of the multi layer wiring transferring intermediate body 109 is removed to complete the multi layer wiring substrate of this embodiment.

Further, an intermediate connector 112 (produced by filling an insulation layer with a conductor and then removing a cover film) described in the foregoing embodiment as illustrated in FIG. 10(i) is used in place of the multi layer wiring transferring intermediate body 109 to laminate the multi layer wiring transferring material of this embodiment to the core substrate as illustrated in FIG. 10(j) to manufacture the multi layer wiring substrate 113 of this embodiment.

By this method, the wiring formed on the insulation layer using a film and the core substrate can separately be manufactured and therefore, as compared with a method of successively layering on a core substrate, the manufacturing process can be carried out without contaminating the wiring parts with dust and the entire production yield can be improved.

Further, if only some of the binder contained in the conductive paste is removed in this embodiment in the same manner as the foregoing embodiment, the same effect as that of the foregoing embodiment can be obtained since the adhesive of the adhesive layer 100a and the binder contained in the conductive paste exist in voids of the via while being mixed with each other or phase-isolated (island structure).

Further, also in this embodiment as same in the foregoing embodiment, the same effect can be achieved even in the state where the voids in the via are not completely filled and a gas is left in some portions in the conductive filler-agglomerated parts in the via.

(iv) In all of the foregoing embodiments, although description given is of a wiring substrate comprising conductive via filled with a conductive filler as a functional substance, a wiring substrate comprising general functional via such as thermally conductive via to heighten the thermal conductivity between neighboring wirings and resistor via to provide resistance components in the via parts can be manufactured in the same manner as the above described embodiments according to the present invention. That is the case of forming thermally conductive via using a thermally conductive filler of such as aluminum oxide and silicon dioxide in place of the conductive filler in the above described embodiments and the case of forming resistor via using carbon powder such as carbon black and the like and ruthenium oxide as a filler.

ADVANTAGES OF THE INVENTION

The present invention provides a multi layer wiring substrate possible to mount semiconductor chips of LSI or the like at a high density thereon and suitable to be employed in multi layer structure in which both of a low inter-layer connection resistance and excellent insulation resistance are satisfactorily achieved.

What is claimed is:

1. A wiring substrate comprising:

two or more wiring layers;

insulation layers interposed between said neighboring wiring layers; and a via formed in the insulation layers so as to connect said wiring layers to one another, wherein said via is characterized in containing a plurality of functional substances while keeping voids in the surroundings, and wherein the voids include first voids where at least the organic resins from the insulation layer exist and second voids where a gas exists said second voids are selectively formed in the portions where the agglomerated functional substances exist.

2. The wiring substrate as claimed in claim 1, characterized in that said second voids have a smaller average volume than the average volume of a plurality of the respective functional substances forming at least the agglomeration portions among the functional substances.

3. The wiring substrate as claimed in claim 1, characterized in that said functional substances are one or more conductive fillers, and that said insulation layers are made of composite materials of organic or inorganic woven cloth impregnated with said organic resins or composite materials of organic or inorganic non-woven cloth impregnated with the organic resins.

4. The wiring substrate as claimed in claim 1, characterized in that said functional substances are one or more conductive fillers, and that said insulation layers are made of composite materials containing organic or inorganic fillers and said organic resins.

5. A wiring substrate comprising:

two or more wiring layers;

insulation layers interposed between said neighboring wiring layers; and a via formed in the insulating layers so as to connect said wiring layers to one another, wherein each of said insulation layers comprises an insulating substrate and at least one adhesive layer containing adhesives, said at least one adhesive layer formed on a first surface of said insulating substrate, said first surface being one of an upper surface or a lower surface of said insulating substrate, and wherein said via contains functional substances and the adhesives of said adhesive layer penetrating and existing in the voids in the surroundings of the functional substances.

6. The wiring substrate as claimed in claim 5, characterized in that said voids include first voids where at least said adhesive exist and second voids where a gas exists.

7. The wiring substrate as claimed in claim 6, characterized in that said functional substances are agglomerated and said second voids are selectively formed in the portions where the agglomerated functional substances exist, among said functional substances.

8. The wiring substrate as claimed in claim 7, characterized in that said second voids have a smaller average volume than the average volume of a plurality of the respective functional substances forming at least the agglomeration portions among the functional substances.

9. The wiring substrate as claimed in claim 7, characterized in that the volume ratio of said functional substances occupying said via is 30% or higher.

10. A method for manufacturing a wiring substrate comprising:
a first process of forming via in which voids are formed by filling functional substances in via holes formed in an insulation substrate containing an organic resin and removing at least some of the functional substances; and
a second process of making said voids be first voids in which at least an organic resin from the insulation substrate exists and be second voids in which a gas exists.

11. The method for manufacturing a wiring substrate as claimed in claim 10, characterized in that said functional substances are agglomerated and said second voids are selectively formed in the portions where said agglomerated functional substances exist in said second process.

12. The method for manufacturing a wiring substrate as claimed in claim 11, characterized in that said vias operate to couple metal conductors to one another, said metal conductors comprising either metal foils or wiring patterns.

13. The method for manufacturing a wiring substrate as claimed in claim 10, characterized in that the average volume of said second voids is made smaller than the average volume of a plurality of the respective functional substances forming at least the agglomeration portions in said second process.

14. The method for manufacturing a wiring substrate as claimed in claim 13, characterized in that said vias operate to couple metal conductors to one another, said metal conductors comprising either metal foils or wiring patterns.

15. The method for manufacturing wiring substrate as claimed in claim 10, characterized in that said first process is carried out using one or more conductive fillers as said functional substances and comprises a step of filling said via holes with a conductive paste containing the conductive fillers and an organic binder and a step of removing at least a part of the organic binder of said conductive paste.

16. The method for manufacturing a wiring substrate as claimed in claim 15, characterized in that said organic binder contains a volatile component and at least a part of said organic binder is removed by evaporating said volatile component.

17. The method for manufacturing a wiring substrate as claimed in claim 15, characterized in that at least a part of said organic binder is removed by sucking said organic binder.

18. The method for manufacturing a wiring substrate as claimed in claim 10, characterized in that said first process is carried out using one or more conductive fillers as the functional substances and comprises a step of filling said via holes with the conductive fillers.

19. The method for manufacturing a wiring substrate as claimed in claim 18, characterized in that said conductive fillers are granulated bodies produced by granulating conductive particles.

20. The method for manufacturing a wiring substrate as claimed in claim 10, characterized in that the first voids are penetrated with the organic resin by applying pressure to an insulation substrate in the thickness direction by metal conductors disposed in both sides out the insulation substrate.

21. The method for manufacturing a wiring substrate as claimed in claim 10, characterized in that said vias operate to couple metal conductors to one another, said metal conductors comprising either metal foils or wiring patterns.

22. A method for manufacturing a wiring substrate comprising:
a first process of forming vias in which voids are formed by filling functional substances in via holes formed in an insulation layer, said insulating layer comprising an insulating substrate and at least one adhesive layer formed on a first surface of said insulating substrate, said first surface being one of an upper surface or a lower surface of said insulating substrate; and
a second process of penetrating the voids of said via hole with the adhesive of said adhesive layer.

23. The method for manufacturing a wiring substrate as claimed in claim 22, characterized in that said voids are selectively penetrated with said adhesive in said second process.

24. The method for manufacturing a wiring substrate as claimed in claim 23, characterized in that first voids are penetrated with the adhesive by being selectively penetrated with said adhesive by agglomerating said functional substances and second voids where a gas exist are formed in said second process.

25. The method for manufacturing a wiring substrate as claimed in claim 24, characterized in that the average volume of said second voids is made smaller than the average volume of a plurality of the respective functional substances forming at least the agglomeration portions in said second process.

26. The method for manufacturing a wiring substrate as claimed in claim 22, characterized in that the voids in via are penetrated with the adhesive by applying pressure to an insulation substrate in the thickness direction by metal conductors disposed in both sides of the insulation substrate.

27. The method for manufacturing a wiring substrate as claimed in claim 22, characterized in that said vias operate to couple metal conductors to one another, said metal conductors comprising either metal foils or wiring patterns.

* * * * *